(12) United States Patent
Morana et al.

(10) Patent No.: US 7,001,190 B2
(45) Date of Patent: Feb. 21, 2006

(54) REPAIRABLE BALL GRID ARRAY CONTACT

(75) Inventors: Francis P. Morana, Mechanicsburg, PA (US); David S. Szczesny, Hershey, PA (US)

(73) Assignee: Tyco Electronics Corporation, Middletown, PA (US)

( * ) Notice: Subject to any disclaimer, the term of this patent is extended or adjusted under 35 U.S.C. 154(b) by 0 days.

(21) Appl. No.: 10/832,171

(22) Filed: Apr. 26, 2004

(65) Prior Publication Data

US 2005/0239301 A1  Oct. 27, 2005

(51) Int. Cl.
*H01R 12/00* (2006.01)
*H05K 1/00* (2006.01)

(52) U.S. Cl. .......................................... 439/81; 439/83
(58) Field of Classification Search .................. 439/83, 439/81, 70, 71, 74, 75, 345, 733.1
See application file for complete search history.

(56) References Cited

U.S. PATENT DOCUMENTS

| | | | |
|---|---|---|---|
| 5,997,317 A | 12/1999 | Pei et al. ........................ 439/83 |
| 6,024,584 A | 2/2000 | Lemke et al. ................... 439/83 |
| 6,099,365 A | 8/2000 | Cachina et al. ............. 439/876 |
| 6,425,785 B1 * | 7/2002 | Azuma .................... 439/733.1 |
| 6,478,599 B1 * | 11/2002 | McHugh et al. ............. 439/342 |
| 6,558,170 B1 * | 5/2003 | Lemke ......................... 439/83 |
| 6,712,626 B1 * | 3/2004 | Harper et al. ................. 439/83 |
| 6,875,025 B1 * | 4/2005 | Hsu et al. ...................... 439/71 |

\* cited by examiner

*Primary Examiner*—Chandrika Prasad

(57) ABSTRACT

An electrical contact for a ball grid array connector includes a platform for holding a solder ball and a body having a first end frictionally coupled to the platform and an opposite second end that includes a separable interface configured to mate with a mating contact. The body is separable from the platform when the platform is mounted to a circuit board.

20 Claims, 3 Drawing Sheets

REPAIRABLE BALL GRID ARRAY CONTACT

BACKGROUND OF THE INVENTION

The invention relates generally to surface mounted connectors on printed circuit boards, and more specifically to a repairable contact for a ball grid array connector.

The ongoing trend toward smaller, lighter, and higher performance electrical components and higher density electrical circuits has led to the development of surface mount technology in the design of printed circuit boards. As is well understood in the art, surface mountable packaging allows for the connection of an electronic module, or package, to pads on the surface of the circuit board rather than by contacts or pins soldered in plated holes going through the circuit board. Surface mount technology allows for an increased component density on a circuit board, thereby saving space on the circuit board and/or allowing for reductions in board size.

The ball grid array (BGA) is one particular type of surface mount package that has been developed in response to the demand for an increased density of electrical connections on the circuit board. The ball grid array includes an array of connections on the bottom side of the connector. In the ball grid array, pins extending into the circuit board are replaced by small solder balls placed on the bottom side of the connector at each contact location. The circuit board, rather than holes, has an array of contact pads matching the solder ball placements on the connector bottom. Connections are made by reflowing the solder balls to mechanically and electrically engage the connector to the circuit board.

BGA technology offers the advantages of higher connection densities on the circuit board and higher manufacturing yields which lowers product cost. However, BGA technology is not without disadvantages. For instance, solder joints cannot be easily inspected, and circuit board level rework, i.e. correcting problems after attachment of the BGA package to the circuit board, is more difficult since, having no replaceable components, the BGA connectors are typically unserviceable.

Thus, a need exists for a ball grid array connector that is serviceable after the ball grid array package has been reflowed onto the circuit board.

BRIEF DESCRIPTION OF THE INVENTION

In an exemplary embodiment of the invention, an electrical contact is provided that includes a platform for holding a solder ball and a body having a first end frictionally coupled to the platform and an opposite second end that includes a separable interface configured to mate with a mating contact. The body is separable from the platform when the platform is mounted to a circuit board.

Optionally, the platform includes a dish-shaped surface for retaining the solder ball. The platform includes a pair of opposed clamping beams, each of which includes a substantially rigid arm and a contact surface that frictionally engages the body first end.

In another embodiment, an electrical contact for a ball grid array connector is provided that includes a platform for holding a solder ball, the platform including a pair of opposed clamping beams, and a body having a first end that includes a plate having substantially parallel opposed side surfaces. The side surfaces are frictionally engaged between the beams. The body has an opposite second end that includes a separable interface configured to mate with a mating contact. The body first end is separable from the platform when the platform is mounted to a circuit board.

In another embodiment, a ball grid array connector is provided. The connector includes a housing having a mating end for receiving a mating connector, an opposite mounting end, and a plurality of contact cavities extending between the mating and mounting ends. A contact is received in each contact cavities. Each contact includes a first portion configured to be mounted to a circuit board and a second portion separable from the first portion when the first portion is mounted to the circuit board.

DETAILED DESCRIPTION OF THE INVENTION

Figure 1:
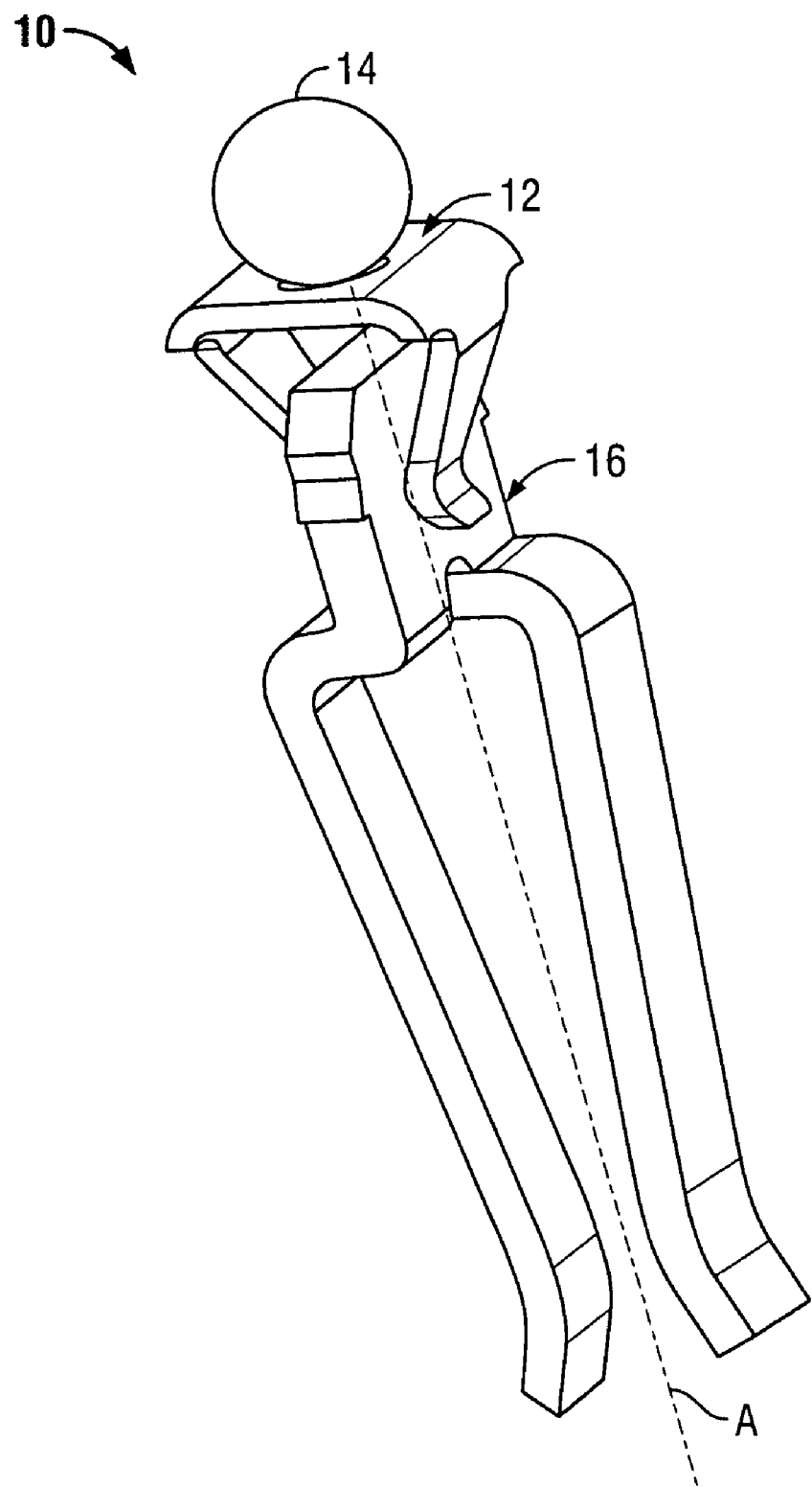
FIG. 1 is a perspective view of a ball grid array contact according to an exemplary embodiment of the present invention.

FIG. 1 illustrates a contact 10 for a ball grid array (BGA) connector according to an exemplary embodiment of the present invention. The contact 10 includes a platform 12 for holding a solder ball 14, and a body 16. The contact 10 has a longitudinal axis of symmetry A. The contact 10 is designed to be surface mounted to a circuit board (not shown). When the contact 10 is mounted on a circuit board surface, the contact 10 is oriented such that the platform 12 faces and is soldered to the circuit board. The body 16 is separable from the platform 12 which allows the body 16 to be removed for repair or replacement before or after the contact 10 has been mounted on the circuit board.

Figure 2:
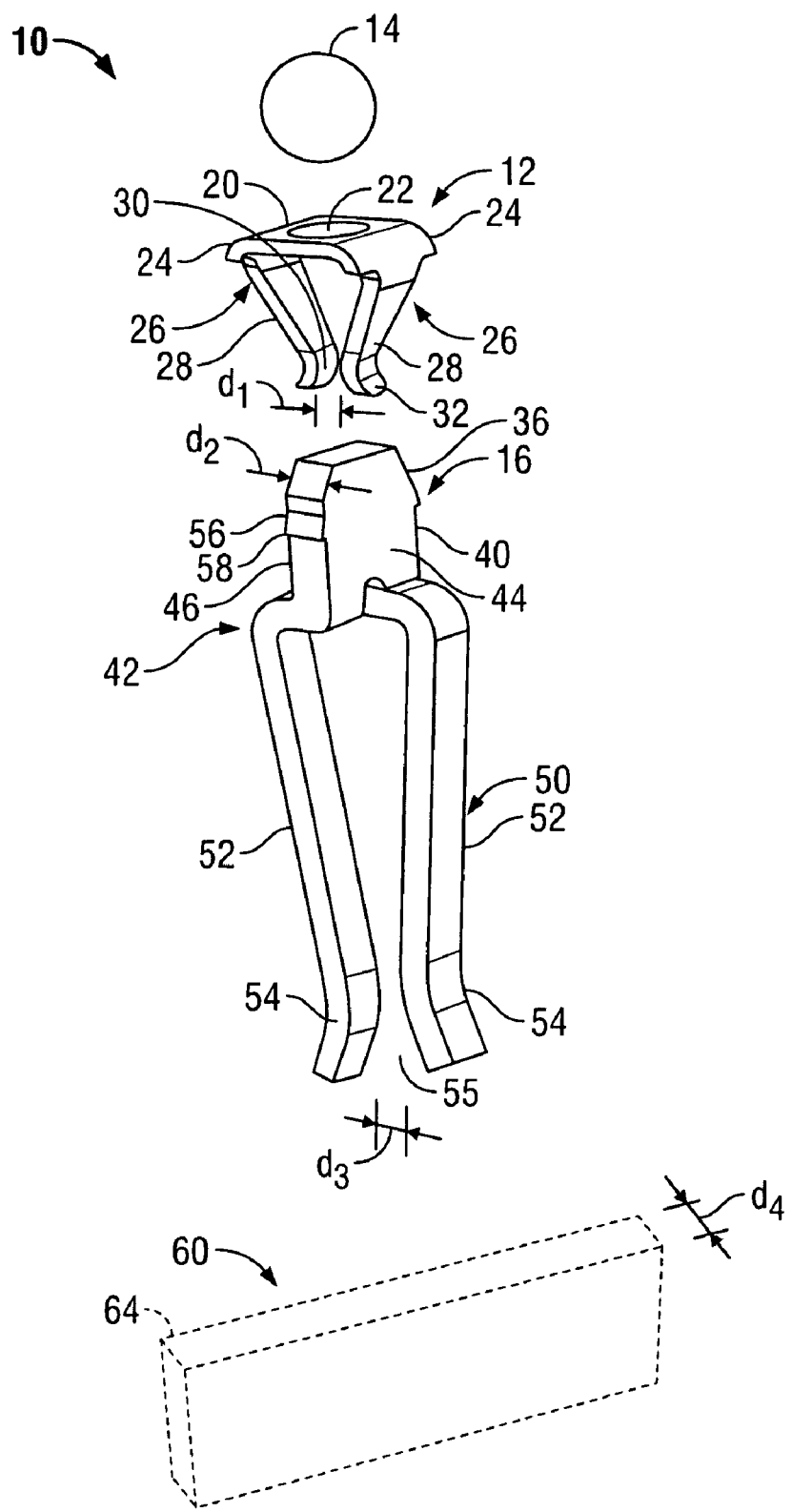
FIG. 2 is an exploded view of the contact shown in FIG. 1.

FIG. 2 is an exploded view of the contact 10. The platform 12 includes a generally planar mounting surface 20 that includes a centrally positioned dish-shaped area 22 that cradles the solder ball 14. The platform 12 includes rounded shoulders 24 on opposite sides thereof from which clamping beams 26 extend. Each clamping beam 26 includes a substantially rigid arm 28 that has a clamping surface 30 proximate clamping ends 32. Clamping ends 32 are separated by a distance d, and are curved outwardly to facilitate the entry of a portion of the body 16 therebetween.

The body 16 includes a first end 36, a mid section 40 and a second end 42. The first end 36 and midsection 40 form a plate-like structure having substantially parallel opposed side surfaces 44 and 46 and a thickness $d_2$ therebetween. The first end 36 is received between the clamping ends 32 of the platform 12 when the body 16 is joined with the platform 12. The body thickness $d_2$ is slightly greater than the distance $d_1$ between the clamping ends 32 such that the body 16 is held between the clamping ends 32 with a friction fit when the body 16 and the platform 12 are joined. The midsection 40 also includes one or more barbs 56 with edges 58.

The body second end 42 includes a separable interface 50 that extends from the body second end 42 in a direction along the longitudinal axis A (shown in FIG. 1). The separable interface 50 includes a pair of legs 52, each having a contact prong 54. The contact prongs 54 are separated by a space 55 that has a distance $d_3$ that is sized to be slightly smaller than the thickness $d_4$ of a mating connector 60 (shown in phantom in FIG. 2), which in one embodiment may be a circuit board wafer or other card edge connector. When the mating connector 60 is inserted between the prongs 54, the legs 52 flex and are spread apart slightly which generates a clamping force on the mating connector 60 that retains the mating connector 60.

Figure 4:
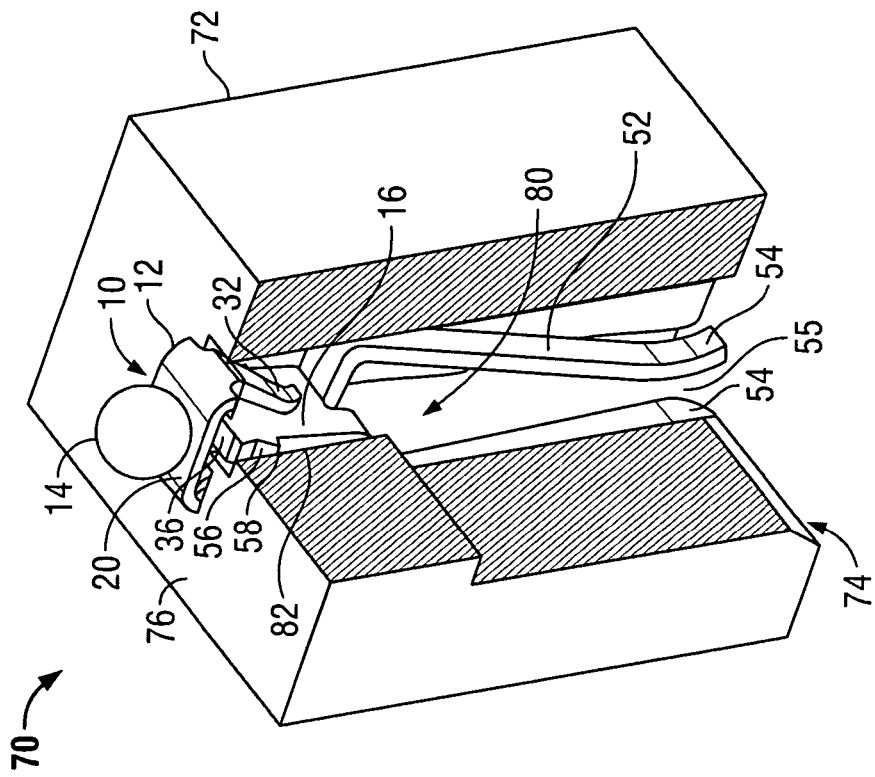
FIG. 4 is a perspective view of the segment of a ball grid array connector shown in FIG. 3 with a portion of the housing cut away.
Figure 3:
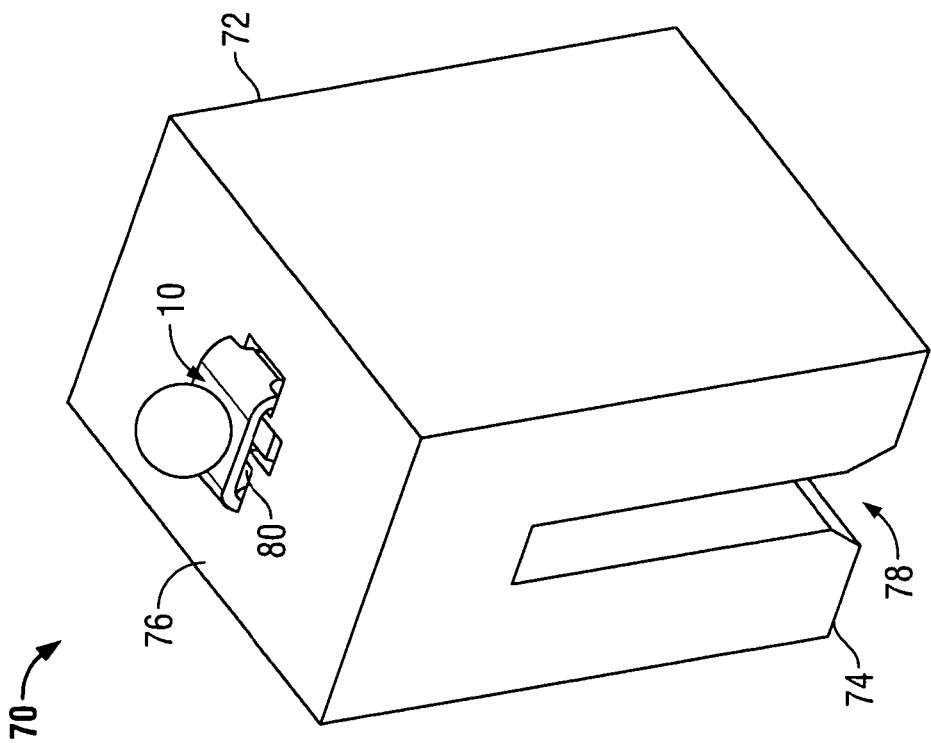
FIG. 3 is a perspective view of a segment of a ball grid array connector according to an exemplary embodiment of the present invention.

FIGS. 3 and 4 illustrate a segment 70 of a BGA connector that includes the contact 10 and a housing segment 72. The entire BGA connector (not shown) contains a plurality of the segments which are substantially identical to the segment 70, with the exception that the connector housing is a unitary structure having a plurality of contact cavities that accommodate a plurality of individual contacts 10. Hereinafter, the housing segment 72 will be referred to as the housing.

The housing 72 includes a mating end 74, a mounting end 76, and a slot 78 that extends through the housing mating end 74. The slot 78 is sized to receive the contact edge 64 of a mating connector 60 (shown in FIG. 2). The housing 72 also includes a contact cavity 80 that extends from the mating end 74 to the mounting end 76. The contact 10 is loaded into the contact cavity 80 in the housing 72 and oriented such that the platform 12 is positioned proximate the housing mounting end 76. The contact body 16 and the separable interface 50 (see FIG. 2) are retained in the housing 72 with legs 52 of the separable interface 50 oriented toward the housing mating end 74. More particularly, the slot 78 extends through the space 55 between the contact prongs 54 such that when the contact edge 64 of the mating connector 60 is inserted in the slot 78, the contact edge 64 of the mating connector 60 is also received in the space 55 between the contact prongs 54 of the separable interface 50.

The contact 10 is loaded into a contact cavity 80 in the housing 72 from the mating end 74 by guiding the body 16 through the contact cavity 80. As the contact 10 is inserted into the housing 72, the barbs 56 engage the contact cavity side walls 82. The edges 58 of barbs 56 are sufficiently sharp to dig into the insulative material to inhibit extraction of the contact body 16 from the housing 72. When the contact 10 is inserted, the separable interface 50 is oriented such that the slot 78 extends through the space 55 between the contact prongs 54, so that the contact edge 64 of a mating connector 60, when inserted into the slot 78, will also be received in the space 55 between the contact prongs 54. When the contact 10 is fully inserted in the housing 72, the platform 12 extends slightly beyond the housing mounting end 76 so that the mounting surface 20 of the platform 12 is external to the housing 72. After pasting the solder ball 14 onto the platform mounting surface 20, the connector 70 is prepared for mounting on a circuit board (not shown).

After being mounted on the circuit board, the housing 72 and the contact body 16, including the separable interface 50 can be separated from the platform 12 should it become necessary to replace or repair the separable interface 50. For instance, should one of the separable interface contact prongs 54 or legs 52 become bent or otherwise damaged, that part of the connector 70 can be repaired or replaced. Removal of the housing 72 and separable interface 50 is accomplished by grasping the housing 72 and pulling the contact body 16 away from the circuit board in a direction parallel to the contact longitudinal axis A (see FIG. 1). The repaired component, or replacement component is installed by positioning the body first end 36 over the platform 12 attached to the circuit board so that the body first end 36 is aligned to be received between the clamping ends 32 and then forcing the body first end 36 between the clamping ends 32.

The embodiments thus described provide a repairable BGA contact that is simple to use and economical to manufacture. The connector housing with the contact body are separable from the contact platform thus providing some servicing capability after the connector has been mounted on a circuit board.

While the invention has been described in terms of various specific embodiments, those skilled in the art will recognize that the invention can be practiced with modification within the spirit and scope of the claims.

What is claimed is:

1. An electrical contact comprising:
    a platform having a mounting surface configured to hold a solder ball, said mounting surface being joined to a pair of opposed clamping beams extending from opposite sides of said mounting surface; and
    a body having a first end frictionally coupled to said platform and an opposite second end comprising a separable interface configured to mate with a mating contact, said body being separable from said platform when said platform is mounted to a circuit board.

2. The electrical contact of claim 1, wherein said platform includes a dish-shaped surface for retaining the solder ball.

3. The electrical contact of claim 1, wherein said platform includes a pair of opposed clamping beams, said body first end being received between said clamping beams.

4. The electrical contact of claim 1, wherein said platform includes a pair of opposed clamping beams, each said clamping beam including a substantially rigid arm and a clamping surface that frictionally engages said body first end.

5. The electrical contact of claim 1, wherein said platform includes a pair of opposed clamping beams, each said clamping beam extending from a rounded shoulder on said platform.

6. The electrical contact of claim 1, wherein said body includes a barb to retain said body within a housing.

7. The electrical contact of claim 1, wherein said separable interface includes a pair of legs extending from said body, said legs being spaced apart to receive a mating contact.

8. An electrical contact for a ball grid array connector, said contact comprising:
    a platform having a mounting surface configured to hold a solder ball, said mounting surface being joined to a pair of opposed clamping beams extending from opposite sides of said mounting surface; and
    a body having a first end comprising a plate having substantially parallel opposed side surfaces, said side surfaces being frictionally engaged between said beams, and an opposite second end comprising a separable interface configured to mate with a mating contact, said body first end being separable from said platform when said platform is mounted to a circuit board.

9. The electrical contact of claim 8, wherein each said clamping beam includes a substantially rigid arm and a clamping surface that frictionally engages said body first end.

10. The electrical contact of claim 8, wherein each said clamping beam extends from a rounded shoulder on said platform.

11. The electrical contact of claim 8, wherein said body includes a barb to retain said body within a housing.

12. A ball grid array connector comprising:
a housing having a mating end for receiving a mating connector, an opposite mounting end, and a plurality of contact cavities extending between said mating and mounting ends; and
a plurality of contacts, each said contact received in a respective one of said plurality of contact cavities, each said contact including a first portion and a second portion, said second portion configured to be mounted to a circuit board and said first portion being separable from said second portion when said second portion is mounted to the circuit board, each said contact including a platform having rounded shoulders and a pair of opposed clamping beams, each said clamping beam extending from one of said rounded shoulders on said platform.

13. The connector of claim 12 further comprising a plurality of solder balls, each said solder ball attached to a respective one of said plurality of contacts.

14. The connector of claim 12, wherein said housing and said contact second portions are removable from the circuit board when said contact first and second portions are separated.

15. The connector of claim 12, wherein said first portion of each of said plurality of contacts includes said platform said second portion of said contact being frictionally retained between said clamping beams.

16. The connector of claim 12, wherein said second portion of each of said plurality of contacts comprises a body having a first end and a second end, said first end being frictionally retained in said first portion of said contact and said second end comprising a separable connector interface configured to mate with a mating contact.

17. The electrical contact of claim 12, wherein said second portion of each said contact includes a separable interface, said separable interface including a pair of legs extending from said second portion of said contact, said legs being spaced apart to receive a mating contact.

18. The connector of claim 12, wherein said first portion of each of said plurality of contacts includes said platform, and each said clamping beam comprising a substantially rigid arm and a clamping surface that frictionally engages and retains said second portion of said contact.

19. The electrical contact of claim 12, wherein said second portion of each said contact includes a barb to secure said contact within one of said contact cavities.

20. The connector of claim 12, wherein said second portion of each of said plurality of contacts comprises a body having a first end and a second end, said second end comprising a separable interface configured to mate with a mating contact, said separable interface being contained within said housing mating end.

* * * * *